United States Patent [19]

Cook

[11] Patent Number: 4,594,126

[45] Date of Patent: Jun. 10, 1986

[54] GROWTH OF THIN EPITAXIAL FILMS ON MOVING SUBSTRATES FROM FLOWING SOLUTIONS

[76] Inventor: Melvin S. Cook, P.O. Box 38, Saddle River, N.J. 07458

[21] Appl. No.: 630,211

[22] Filed: Jul. 12, 1984

Related U.S. Application Data

[63] Continuation-in-part of Ser. No. 531,230, Sep. 12, 1983.

[51] Int. Cl.⁴ ............................................. C30B 19/06
[52] U.S. Cl. .................... 156/608; 156/624; 427/86
[58] Field of Search ............... 156/608, 622, 623 R, 156/624, DIG. 70; 148/171, 172; 118/412, 415, 422; 427/86; 422/245, 253

[56] References Cited

U.S. PATENT DOCUMENTS

| Re. 28,140 | 8/1974 | Bergh et al. | 148/172 |
|---|---|---|---|
| 3,249,404 | 5/1966 | Bennett | 156/608 |
| 3,880,680 | 4/1975 | Weyrich et al. | 148/171 |
| 4,319,953 | 3/1982 | Grabmaier | 156/622 |
| 4,357,897 | 11/1982 | Leswin | 118/412 |

Primary Examiner—David L. Lacey
Attorney, Agent, or Firm—Gottlieb, Rackman & Reisman

[57] ABSTRACT

An apparatus and method for the growth of thin epitaxial layers on crystalline substrates. A portion of the growth surface of a substrate held at temperature $T_2$ is contacted with a solution with a saturation temperature $T_s$ in a narrow channel while the solution is in streamline flow in the channel. The substrate is mounted on a slider. As the slider is moved across the narrow channel, progressively different portions of the growth surface are exposed to, and withdrawn from exposure to, the flowing solution. The rate of growth of epitaxial material on the growth surface of the substrate is determined by the relationship between $T_s$, $T_2$ and the temperature $T_1$ of the solution as it enters the narrow channel. The thickness of the epitaxial layer on a portion of the growth surface is determined by the rate of growth of epitaxial material and the dwell time during which the portion of the growth surface is exposed to the flowing solution.

2 Claims, 3 Drawing Figures

GROWTH OF THIN EPITAXIAL FILMS ON MOVING SUBSTRATES FROM FLOWING SOLUTIONS

DESCRIPTION

This application is a continuation-in-part of my copending application entitled "RAPID LPE CRYSTAL GROWTH", Ser. No. 531,230, filed on Sept. 12, 1983. That application disclosed a method and apparatus for the growth of epitaxial layers ("epilayers") on substrates by liquid phase epitaxy.

The present invention relates to a method and apparatus for the growth of thin epilayers on substrates by liquid phase epitaxy. It can be used, for example, to grow thin epilayers in forming shallow homojunctions or heterojunctions, or to produce semiconductor superlattices.

Epilayers grown by liquid phase epitaxy can possess very good crystal quality. However, it is difficult to grow thin epilayers with precise thicknesses by liquid phase epitaxy, and the techniques have not been suitable for high-throughput production. It has also been difficult to grow ternary and quaternary semiconductor compounds with uniform composition using liquid phase epitaxy.

It is an object of my invention to provide a method for the growth by liquid phase epitaxy of thin epilayers with precise thicknesses.

It is an additional object of my invention to provide apparatus for the growth by liquid phase epitaxy of thin epilayers with precise thicknesses.

Briefly, in accordance with the principles of my invention and in the preferred embodiment thereof, a portion of the surface (the "growth surface") of a crystalline substrate on which an epilayer is desired is brought into contact with solution moving in streamline flow through a narrow channel. For the purposes of the present invention, a narrow channel is one with a cross-section orthogonal to the direction of solution flow which has at least one dimension which is sufficiently small such that the frictional forces introduced at the channel walls lead to streamline flow of the solution at the position (the "growth position") where the solution contacts the growth surface of the substrate. Such streamline flow of solution across the growth surface is beneficial in that it helps in obtaining epilayers with smooth surfaces and uniform compositions even where, e.g. ternaries or quaternaries are involved.

Preferably, at the entrance to the narrow channel, the solution temperature, $T_1$, is at or slightly above the solution saturation temperature, $T_s$. The substrate temperature, $T_2$, is held at or slightly below $T_s$, depending on the desired epilayer thickness and whether or not substrate etchback must be avoided. If etchback must be avoided, $T_2$ may be as much as 5 Centigrade degrees below $T_s$. $T_2$ can be controlled by means of a coolant fluid, e.g. hydrogen gas, flowing across the reverse side of the substrate.

The rate of epilayer growth on that portion of the growth surface in contact with solution flowing through the narrow channel is a function of $T_1$, $T_2$, and $T_s$. The closer that $T_2$ is to $T_s$, the slower will be this rate of epilayer growth for a given $T_1$.

The substrate is mounted on a slider. During the process of epilayer growth, the substrate is moved across the narrow channel by moving the slider. By such means, different portions of the growth surface are progressively brought into contact with, or removed from contact with the solution flowing in the narrow channel at the growth position. The interval of time during which a given portion of the growth surface is exposed to the solution flowing in the narrow channel at the growth position is its "dwell time". For a given $T_1$, $T_2$, and $T_s$, the greater the dwell time is, the thicker will be the epilayer grown on a given portion of the growth surface.

In a particular example, gallium solution saturated with arsenic and containing a n-type dopant was used to grow a 600 Angstrom thick homojunction on a p-type gallium arsenide substrate. With $T_s$ equal to 760° Centigrade, $T_1$ equal to $T_s$, and $T_2$ equal to 758° Centigrade, a dwell time of 3 seconds gave the epilayer of the required thickness.

Further objects, features, and advantages of my invention will become apparent upon consideration of the following detailed description in conjunction with the drawing, in which.

Figure 1:
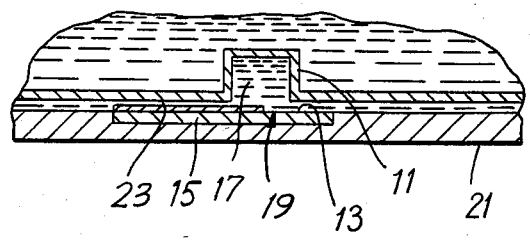
FIG. 1 is a fragmentary representation in cross-section of the relationship between a narrow channel and a substrate.

In FIG. 1, the relationship between a narrow channel 11 and a substrate 15 is shown schematically in cross-section. Solution 17 flowing through the narrow channel contacts the growth surface 13 of the substrate at the growth position 19. The substrate is mounted on slider 21. As the slider moves to the left, different portions of the growth surface are progressively brought into contact with the solution flowing in the narrow channel, and removed from such contact. The epilayer 23 grows on the growth surface where it is exposed to the flowing solution.

Figure 2:
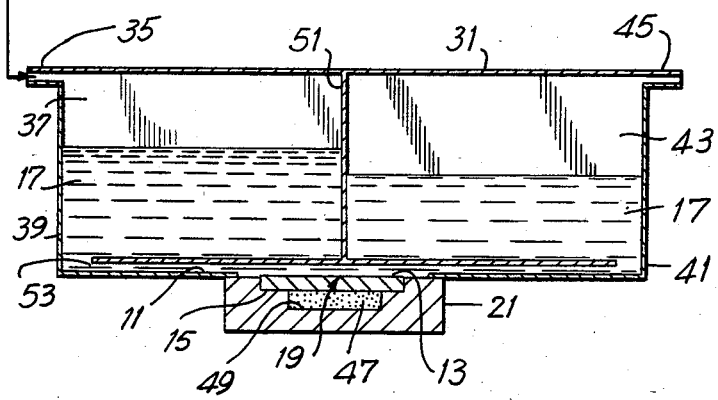
FIG. 2 is a cross-section of an apparatus for epilayer growth.

In FIG. 2, a cross-section is shown of apparatus 31 for the growth of epilayers. This cross-section is orthogonal to the partial cross-section shown in FIG. 1. Gas under pressure, e.g. hydrogen gas, entering space 37 via inlet 35 causes some of solution 17 from well 39 to flow through narrow channel 11, and then to join the portion of solution 17 in well 41. The source of gas is not shown, but any of conventional sources, e.g. a gas tank, can be used for this purpose. The gas pressure in space 43 is relieved via outlet 45. The means of relieving the gas pressure in space 43 via outlet 45 is not shown, but any of conventional means, e.g. a gas pump, can be used for this purpose. Well 39 is separated from well 41 by wall 51, so that their only connection is through the narrow channel 11.

Substrate 15 is mounted on slider 21. The slider moves in a direction which is orthogonal to the plane of FIG. 2, thereby moving the growth surface 13 of the substrate across the growth position 19. Epilayer growth takes place on the portions of the growth surface 13 thus progressively exposed to contact with the flowing solution in the narrow channel.

The substrate temperature, $T_2$, is controlled by means of coolant fluid 47, e.g. hydrogen gas, flowing through conduit 49 of the slider. The source of the coolant fluid is not shown, but any of conventional sources, e.g. a gas tank, can be used for this purpose.

The length of the narrow channel between its inlet 53 and the growth position 19 should, preferably, be sufficient such that laminar flow of the solution takes place over that portion of the growth surface exposed to such flow.

In order to help terminate epilayer growth on portions of the growth surface removed from contact with solution flowing in the narrow channel, the growth surface can be wiped by the apparatus as it moves from the growth position or other means can be used to remove adhering solution as, e.g. gas blowing the solution from that portion of the growth surface removed from the growth position. Some solution may remain adhering to the growth surface after such removal from the growth position, and the additional epilayer growth that will take place from such adhering solution must be allowed for in determining dwell times and the values of $T_1$, $T_2$, and $T_s$.

Superlattices are composed of thin superimposed epilayers which alternate in material composition and which may be, e.g. 100 Angstroms in thickness. While a superlattice can be grown using one or more apparatus such as that shown in FIG. 2, the movements between different apparatus for the substrates would be an expensive and time-consuming process. However, an apparatus incorporating two or more growth positions, each growth position involving solution differing in composition from the adjacent growth position, allows convenient growth of successive epilayers with alternating material compositions.

Figure 3:
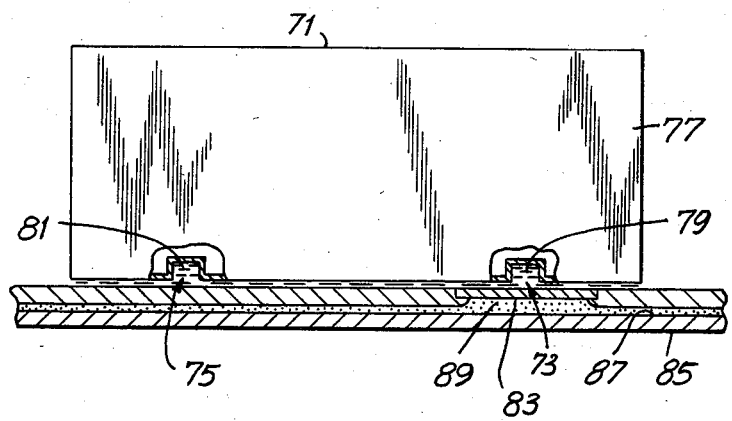
FIG. 3 is a cross-section of an apparatus for epilayer growth incorporating two growth positions.

In FIG. 3, a cross-sectional view is shown of apparatus 71 which incorporates a first growth position 73 and a second growth position 75. The cross-section in FIG. 3 has been taken through wall 77 separating the wells between which solution 79 and solution 81 move.

Substrate 83 is mounted on slider 85. When the substrate is positioned at growth position 73, an epilayer of a first material composition will grow on the substrate, and when the substrate is at growth position 75, an epilayer of a second material composition will grow on the substrate. Each layer is grown by a back-and-forth movement of the slider. After one epilayer has been grown, the substrate is moved to the other growth position so that the next epilayer grown will be of another material composition from the previously-grown epilayer. Of course, in a production-type apparatus, more than two growth positions can be incorporated, thereby eliminating or minimizing back-and-forth movements in the growth of individual epilayers.

Conduit 87 in the slider is used to bring coolant fluid 89 into contact with the substrate in order to control $T_2$.

Although the invention has been described with reference to particular embodiments, it is to be understood that these embodiments are merely illustrative of the application of the principles of the invention. Numerous modifications may be made therein and other arrangements may be devised without departing from the spirit and scope of the invention.

I claim:

1. A method of growing an epitaxial layer of a material on a surface of a substrate from a solution, comprising the steps of moving said surface of said substrate across the width of a first side of a first channel having a length substantially greater than its width, said first channel having an inlet communicating with a reservoir of solution and an outlet communicating with a receiver of solution, forcing at least a part of the solution from the reservoir to enter the first channel via said inlet so as to flow through the first channel and to leave the first channel via said outlet and to enter the receiver, the substrate having a dimension in the direction of movement thereof which is substantially greater than the width of said first side of said first channel so as to expose at any given time only a portion of said surface to contact with said at least part of said solution in said first channel such that different portions of the substrate are successively brought into contact and removed from contact with said at least part of said solution flowing in said first channel, said first channel being configured such that streamline flow of said at least part of said solution takes place in the region of any portion of said surface of the substrate in contact with the flowing solution, causing a coolant fluid to flow in a second channel while in heat exchange relationship with the substrate to lower the temperature of the substrate relative to the saturation temperature of said at least part of said solution entering said first channel, thereby to induce the growth of an epitaxial layer of material on each portion of said surface which is exposed to the flow of said at least part of said solution, said growth of said epitaxial layer of said material on each portion of said surface of the substrate taking place during said flow of said at least part of said solution through said first channel.

2. A method of growing an epitaxial layer on a substrate from a solution in accordance with claim 1, wherein said at least part of said solution flowing into, through and out of said first channel is caused to flow by gas pressure on said solution.

* * * * *